(12) United States Patent
Niederberger

(10) Patent No.: US 12,219,321 B2
(45) Date of Patent: Feb. 4, 2025

(54) MICROELECTROMECHANICAL SYSTEMS SENSOR WITH STABILIZATION CIRCUIT

(71) Applicant: Knowles Electronics, LLC, Itasca, IL (US)

(72) Inventor: Mark Niederberger, Einsiedeln (CH)

(73) Assignee: Knowles Electronics, LLC, Itasca, IL (US)

( * ) Notice: Subject to any disclaimer, the term of this patent is extended or adjusted under 35 U.S.C. 154(b) by 196 days.

(21) Appl. No.: 18/087,327

(22) Filed: Dec. 22, 2022

(65) Prior Publication Data
US 2024/0214747 A1    Jun. 27, 2024

(51) Int. Cl.
*H04R 19/04* (2006.01)
*H03F 3/183* (2006.01)

(52) U.S. Cl.
CPC ............. *H04R 19/04* (2013.01); *H03F 3/183* (2013.01); *H03F 2200/03* (2013.01); *H04R 2201/003* (2013.01)

(58) Field of Classification Search
CPC ........ H04R 19/04; H04R 19/005; H04R 3/06; H04R 2201/003; H03F 3/183; H03F 3/185; H03F 3/505; H03F 2200/03
See application file for complete search history.

(56) References Cited

U.S. PATENT DOCUMENTS

| | | | |
|---|---|---|---|
| 9,743,167 B2 | 8/2017 | Nielsen et al. | |
| 11,095,990 B2 | 8/2021 | Hansen et al. | |
| 2013/0051582 A1* | 2/2013 | Kropfitsch | H03F 1/56 330/144 |

(Continued)

OTHER PUBLICATIONS

Toft, Jakob et al., U.S. Appl. No. 17/960,692, "Microphone Assembly with Disturbance Compensation", filed Oct. 5, 2022.

(Continued)

*Primary Examiner* — Yogeshkumar Patel
(74) *Attorney, Agent, or Firm* — Hickman Becker Bingham Ledesma LLP; Matthew C. Loppnow

(57) ABSTRACT

A microelectromechanical systems (MEMS) sensor, a capacitive MEMS motor sensing circuit and a method are provided. The MEMS sensor includes a housing having electrical contacts disposed on an exterior of the housing. The MEMS sensor further includes a capacitive MEMS motor disposed in the housing, and an electrical circuit disposed in the housing and being electrically coupled to the electrical contacts. The electrical circuit includes a bias voltage source having an output coupled to an input of the MEMS motor. The electrical circuit further includes an amplifier including an amplifier input stage having an input, coupled to an output of the MEMS motor, the amplifier input stage having a negative input resistance, where a sum of a series resistance of the MEMS motor at the input and the negative input resistance is less than zero, and wherein application of a signal from the output of the MEMS motor to the input of the amplifier input stage produces a negative real part of input current. The electrical circuit still further includes a stabilization circuit having an output coupled to the input of the amplifier input stage, where the stabilization circuit injects a compensation current at the input of the amplifier input stage that offsets at least a portion of the negative real part of input current.

20 Claims, 11 Drawing Sheets

(56) References Cited

U.S. PATENT DOCUMENTS

| | | | | |
|---|---|---|---|---|
| 2014/0307885 A1* | 10/2014 | Schultz | ............... | H04R 3/005 |
| | | | | 381/71.7 |
| 2017/0223455 A1* | 8/2017 | Conklin | ............... | H04R 19/04 |
| 2018/0012588 A1* | 1/2018 | Albers | ............... | H03F 3/45475 |
| 2018/0332377 A1* | 11/2018 | Polo | ............... | H03F 3/505 |
| 2019/0191245 A1* | 6/2019 | Conklin | ............... | H04R 19/04 |
| 2021/0396795 A1* | 12/2021 | Jennings | ............ | G01R 27/2605 |
| 2022/0369013 A1* | 11/2022 | Niederberger | ...... | H03F 3/45475 |
| 2023/0112042 A1* | 4/2023 | Toft | ............... | H04R 1/04 |
| | | | | 381/93 |

OTHER PUBLICATIONS

Jennings, Michael et al., U.S. Appl. No. 18/090,987, "Microelectromechanical Systems Sensor with Frequency Dependent Input Attenuator", filed Dec. 29, 2022.

I.M. Filanovsky et al., "Source follower: A misunderstood humble circuit," 2013 IEEE 56th International Midwest Symposium on Circuits and Systems (MWSCAS), Columbus, OH, USA, 2013, pp. 185-188, doi: 10.1109/MWSCAS.2013.6674616.

* cited by examiner

MICROELECTROMECHANICAL SYSTEMS SENSOR WITH STABILIZATION CIRCUIT

FIELD OF THE DISCLOSURE

The present disclosure is directed to a microelectromechanical systems (MEMS) sensor with a stabilization circuit, and more particularly a stabilization circuit for use with a sensing amplifier input stage connectable to a MEMS motor or resonator.

BACKGROUND

Microphones and other known sensors generally comprise a transduction element that generates an electrical signal representing a sensed environmental condition, like sound, and a signal conditioning circuit and/or interface circuit, like an application specific integrated circuit (ASIC). These components are typically integrated in a package referred to as a sensor assembly. In many instances the interface circuit will incorporate an amplifier, which is used for conditioning the signal produced by a capacitive MEMS motor in response to a sensed condition. Capacitive MEMS motors, such as those for use as a microphone, can have multiple mechanical and acoustic resonances. Depending on the architecture of the MEMS motor, the quality (Q) factor of at least some resonances can have a relatively high value, where Q or quality factor represents a value that describes how underdamped an oscillating circuit is. A higher Q value can mean that the circuit has low damping and will ring or resonate for a longer period of time.

Amplifiers used with a MEMS microphone can often include a source follower input stage, which are at least sometimes known to have a negative input resistance, corresponding to the real part of a complex input impedance. In a microphone arrangement with a high-Q MEMS motor/transducer connected to the input of a source follower amplifier input stage, the microphone system might oscillate. Such an oscillation can occur where the sum of the series resistance of the MEMS motor and the real part of the complex input impedance of the input stage of the associated amplifier is negative or less than zero at or around the frequencies of the MEMS resonances.

The input resistance of the source follower amplifier, including a metal oxide semiconductor (MOS) source follower amplifier can become negative if the source voltage has a lagging phase compared to its gate voltage. The source voltage can have a lagging phase compared to the gate voltage due to capacitive loading on the source and/or a phase shift of the open loop gain. The input current of the amplifier is defined by the gate source capacitance Cgs and the gate source voltage Vgs. Due to the phase shift of the source voltage and the reactive gate-source impedance, the input impedance of the amplifier can have a negative real part that can result in a negative input current when a voltage is applied.

The present inventor have recognized that it may be beneficial to be able to provide a stabilization circuit capable of injecting a compensation current at the input of the amplifier input stage of the associated amplifier, that at least partly compensates for the negative input current, that could be generated by the associated amplifier, such as an MOS source follower amplifier, which would allow the real part of the amplifier input impedance to become less negative or even positive.

SUMMARY

The present application provides a microelectromechanical systems (MEMS) sensor. The MEMS sensor includes a housing having electrical contacts disposed on an exterior of the housing. The MEMS sensor further includes a capacitive MEMS motor disposed in the housing, and an electrical circuit disposed in the housing and being electrically coupled to the electrical contacts. The electrical circuit includes a bias voltage source having an output coupled to an input of the MEMS motor. The electrical circuit further includes an amplifier including an amplifier input stage having an input coupled to an output of the MEMS motor, the amplifier input stage having a negative input resistance, wherein a sum of a series resistance of the MEMS motor at the input and the negative input resistance is less than zero, and wherein application of a signal from the output of the MEMS motor to the input of the amplifier input stage produces a negative real part of input current. The electrical circuit still further includes a stabilization circuit having an output coupled to the input of the amplifier input stage, wherein the stabilization circuit injects a compensation current at the input of the amplifier input stage that offsets at least a portion of the negative real part of input current.

According to another possible embodiment, a capacitive MEMS motor sensing circuit is provided, which comprises an amplifier input stage having an input connectable to an output of a MEMS motor. The amplifier input stage has a negative input resistance, wherein a sum of a series resistance of the MEMS motor at the input and the negative input resistance is less than zero, and wherein application of a signal from the output of the MEMS motor to the input of the amplifier input stage produces a negative real part of input current. The capacitive MEMS motor sensing circuit further includes a stabilization circuit having an output coupled to the input of the amplifier input stage, where the stabilization circuit is adapted to inject a compensation current at the input of the amplifier input stage that offsets at least a portion of the negative real part of input current.

According to another possible embodiment, a method is provided. The method includes producing a DC bias voltage and supplying the produced DC bias voltage to a MEMS motor. A stimulus is detected by the MEMS motor, and a signal having a voltage is produced. The signal is applied to a sensing circuit by applying the signal to an input of an amplifier input stage having a negative input resistance that produces a negative real part of input current. At least a portion of the negative real part of input current is offset by injecting a compensation current, produced by a stabilization circuit, at the input of the amplifier input stage.

These and other objects, features, and advantages of the present application are evident from the following description of one or more preferred embodiments, with reference to the accompanying drawings.

DETAILED DESCRIPTION

Figure 1:
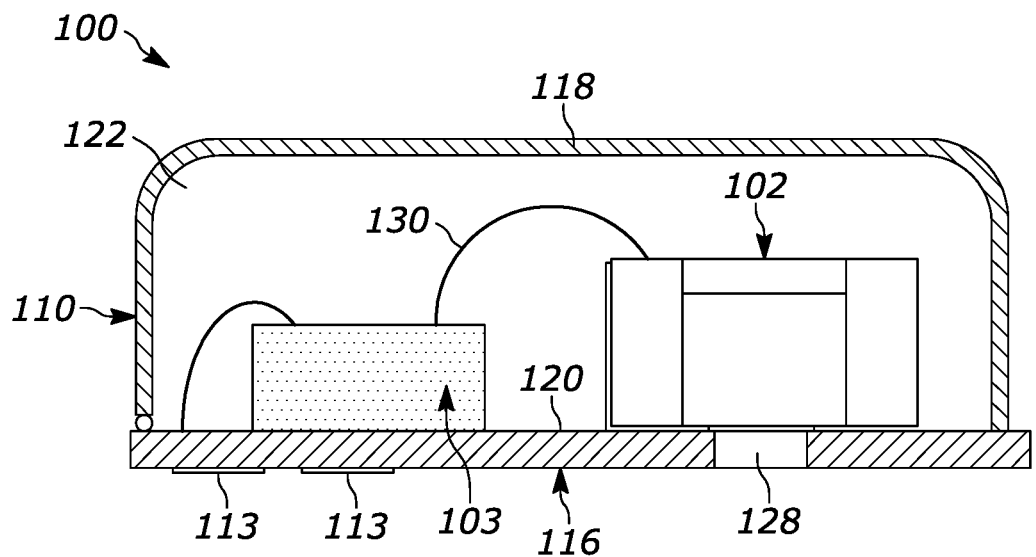
FIG. 1 is a cross sectional view of a microelectromechanical systems (MEMS) sensor.

While the present disclosure is susceptible of embodiment in various forms, there is shown in the drawings and will hereinafter be described presently preferred embodiments with the understanding that the present disclosure is to be considered an exemplification of the invention and is not intended to limit the invention to the specific embodiments illustrated. One skilled in the art will appreciate that the elements in the drawings are illustrated for simplicity and clarity and therefore may have not necessarily been drawn to scale, and may not include some well-known features. For example, the dimensions of some of the elements in the drawings may be exaggerated relative to other elements with the intent to help improve understanding of the aspects of the embodiments being illustrated and described.

The present disclosure relates to sensor assemblies, electrical circuits for use in a sensor assembly, and methods thereof, which make use of an amplifier having an amplifier input stage with a negative input resistance. The electrical circuit incorporates a stabilization circuit for offsetting at least a portion of a negative current associated with the negative input resistance. The sensor assembly generally comprises one or more transduction elements that produce an output signal that is proportional to a sensed environmental condition. The sensor can be a capacitive, piezo or optical electro-acoustic transduction element among other known and future sensors configured to convert the sensed environmental condition into a corresponding electrical signal. Such sensors can be fabricated from microelectromechanical systems (MEMS) or some other known or future technology. In one implementation, the sensor is an acoustic sensor and the electrical circuit is a microphone signal processing circuit. In other implementations, the sensor is a non-acoustic sensor and the electrical circuit is a non-acoustic sensor signal processing circuit. Such other sensors include pressure, temperature, gas, vibration, and humidity sensors, among others.

In accordance with at least one embodiment, a sensor assembly generally comprises a transducer, such as a microelectromechanical systems (MEMS) motor, and an electrical circuit disposed in a housing configured to interface with a host device. In FIG. 1, a cross sectional view of an exemplary sensor assembly 100 is illustrated. The sensor assembly 100 includes a transducer 102 coupled to an electrical circuit 103 disposed within a housing 110. The housing includes a base 116, and a cover 118 fastened to an upper surface 120 of the base. In some implementations, the housing shields the transducer and the electrical circuit located within the interior 122 of the housing from electromagnetic interference like RF noise. For this purpose, the cover can be metal or include a conductive portion electrically coupled to a conductive portion of the base. The housing can also include an electrical interface with contacts (e.g., supply, ground, data, clock, select, etc.) configured to interface with a host device. In FIG. 1, the host-interface is a surface-mount interface 113 located on an outer surface of the base 116 and is suitable for reflow soldering processes. In other embodiments, the host-interface can have some other form factor, like through-hole pins and/or plated through holes to receive through-hole pins, and the interface can be located on another part of the housing.

In some sensor assemblies, like microphones, the housing includes an aperture (also called a "port"), which can connect an interior of the housing to the external environment. In FIG. 1, the port 128 is located on the base 116 in alignment with the transducer 102. In other sensors, the port can be on some other part of the housing, like the cover or the sidewall. A port is not required in other sensor assemblies, like acoustic vibration sensors and accelerometers, among others.

In one embodiment, the sensor assembly is a microphone configured to generate an electrical signal representative of acoustic signals propagated through the atmosphere and detected by a transducer located within the housing. In other embodiments, the sensor assembly is configured to generate an electrical signal representative of vibrations. For example, the sensor assembly can be configured to detect acoustic vibrations propagated through a person's body or an inanimate object. Other sensor assemblies can be configured to detect pressure, acceleration, humidity, or temperature, among other conditions.

The electrical circuit generally comprises a processing circuit configured to process the electrical signal produced by the transducer and to provide the processed signal at the host interface of the sensor assembly. In FIG. 1, the electrical circuit 103 is coupled to the transducer 102 via a connection 130, which can include one or more leads, such as a conductive wire. The electrical circuit is also coupled to contacts on the host-interface 113 via traces in the base for this purpose. The electrical circuit can obtain power, clock and other signals from contacts on the host-interface. In other implementations, the sensor assembly can include the transduction element and sensor signal processing circuit, but these elements are not necessarily disposed in or integrated within a housing.

Figure 2:
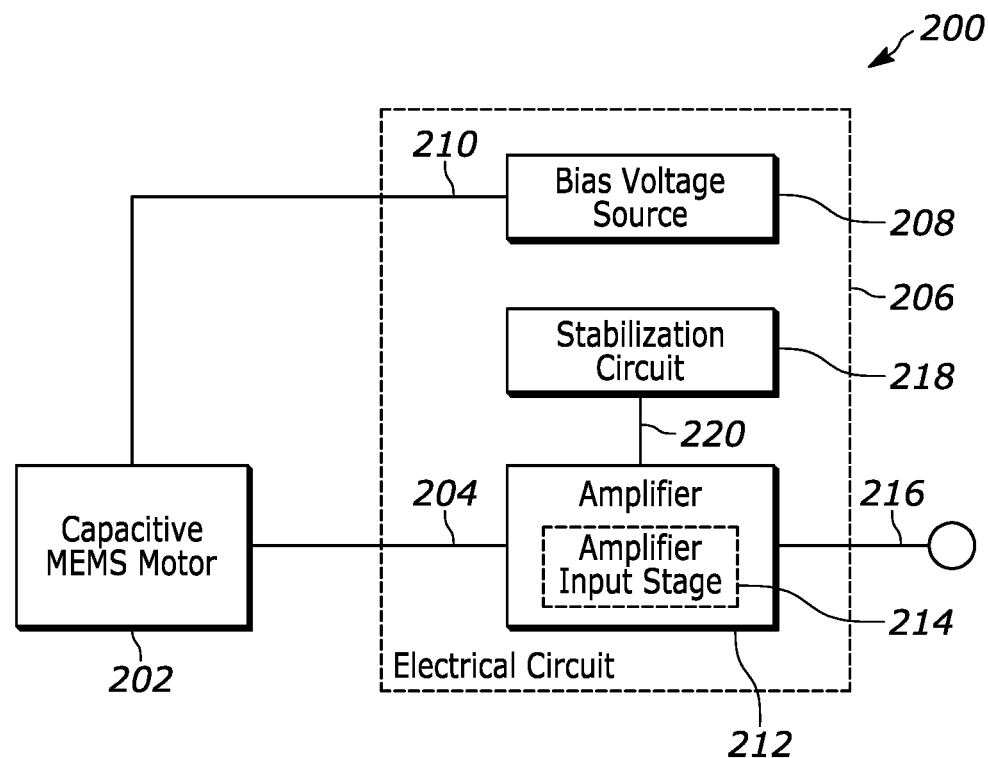
FIG. 2 is a block diagram of a MEMS sensor assembly, in accordance with at least one embodiment of the present application.

FIG. 2 illustrates a block diagram of a sensor assembly 200, in accordance with at least one embodiment of the present application. In the illustrated embodiment, the sensor assembly 200 includes a sensor, such as a capacitive MEMS motor 202, which can have one or more transduction elements organized and arranged for producing one or more electrical signals 204, and which are each associated with a respective one or more output terminals. The sensor assembly further includes an electrical circuit 206 including a bias voltage source 208 that has one or more bias output voltage terminals 210, where a respective one of one or more DC bias voltages is produced at each of the bias output voltage terminals, which are coupled to a transducer requiring a bias, for example, the capacitive MEMS motor 202. The electrical circuit 206 further includes an amplifier 212 having one or more input terminals associated with an amplifier input stage 214, each being coupled to a respective output terminal of the sensor. The amplifier 212 produces at an output including one or more output terminals 216, an amplified output signal.

In at least some configurations, the amplifier input stage 214 will be associated with a type of amplifier that can have a negative input resistance at one or more frequencies of concern. At least a couple of amplifiers that potentially have a negative input resistance can include current feedback amplifiers, simple source follower amplifiers, super source follower amplifiers, and amplifiers having gm input stages. When paired with a sensor having a high quality factor, this can result in a sensor having mechanical and/or acoustic resonators at one or more frequencies that can manifest in the electronic signaling that does not readily dampen out. The number and frequency location of the one or more resonators can sometimes be implementation dependent, with some of them being dependent upon the various geometries of the components that are used to form the sensor assembly, such as the microphone package. Mechanical resonances can manifest into the electronic signaling being produced due to the nature of the device, whereby the intended mechanical movement of one of the capacitive sensor elements in a MEMS type sensor motor, namely the diaphragm relative to a backplate capacitive sensor element in response to an acoustic pressure wave, is used to produce the variance in the electrical signaling produced by the sensor. Depending on the architecture of the MEMS motor, the quality factor of some resonators can reach relatively high values in the range of 10 to 1000.

When a signaling voltage is applied to an input of an amplifier with a negative input resistance, it can result in a negative input current. The electrical circuit 206 further includes a stabilization circuit 218 coupled to the amplifier 212, and more particularly the amplifier input stage 214, for producing a current compensation signal 220, which is intended to at least partially compensate for a negative input current. In at least some instances, this can manifest as an injection of a compensation current, produced by a stabilization circuit, at the input of the amplifier input stage 214, that can reduce or help to avoid at least partially the negative input current.

Figure 3:
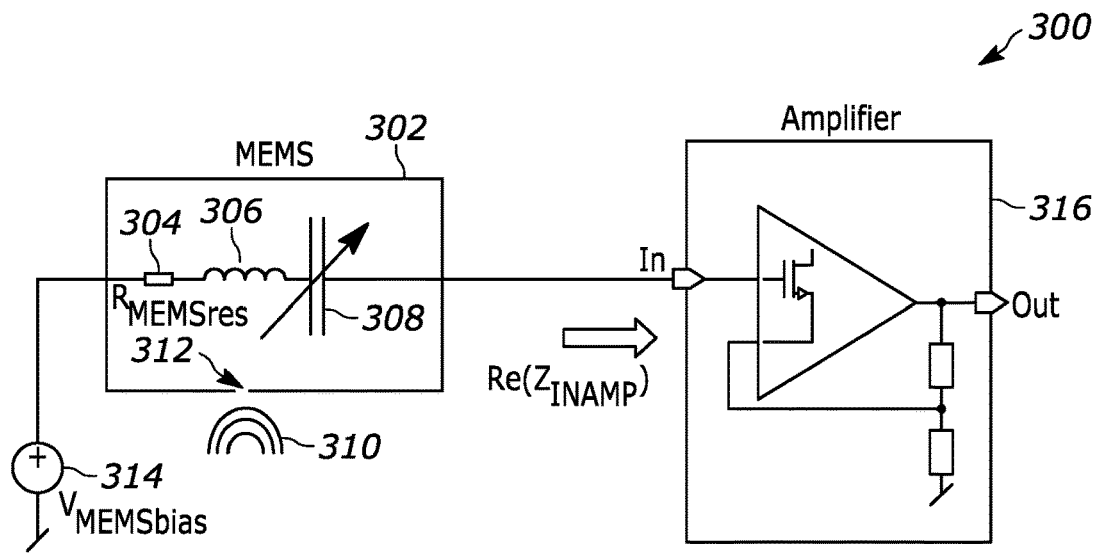
FIG. 3 is a simplified partial schematic diagram of a MEMS sensor assembly.

FIG. 3 illustrates a simplified partial schematic diagram 300 of a MEMS sensor assembly. In the simplified schematic diagram, a capacitive MEMS motor 302 is represented schematically by a resistor 304 in series with an inductor 306 in series with a capacitor 308 whose value can vary. The RLC resonance circuit can be used to sufficiently model the electrical behavior of the MEMS motor 302 for a particular frequency range around a particular resonance frequency. The variance of the capacitor 308 is linked to the pressure waves associated with the amplitude of an acoustic signal 310 that can be detected by the MEMS motor 302 through an acoustic port 312.

The MEMS motor 302, which is modeled as a MEMS equivalent electrical circuit including a resistor 304, inductor 306 and variable capacitor 308, in series, is coupled to a bias voltage source 314, which through the resistor 304 and the inductor 306 causes a charge to be stored across the capacitor 308. As the capacitance of the capacitor 308 is caused to change due to the receipt of a varying acoustic signal, the charge stored across the capacitor causes the voltage at the output of the MEMS motor 302 to change. The voltage at the output of the MEMS motor is coupled to an input of an amplifier 316, which in turn produces an amplified signal at the output of the amplifier. A voltage divided version of the amplified signal is fed back to the input of the amplifier 316.

As noted above, certain configurations of amplifiers can have an input impedance, $Z_{INAMP}$, associated with an amplifier input stage, where the real part, $Re[Z_{INAMP}]$, is less than 0 ohms at one or more resonance frequencies of the MEMS motor. In such an instance, the MEMS sensor assembly can become unstable, when the sum of the series resistance of resistor 304 and the real part of the input impedance, $Re[Z_{INAMP}]$, is less than 0 ohms around frequencies close to the resonances associated with the MEMS motor.

Figure 4:
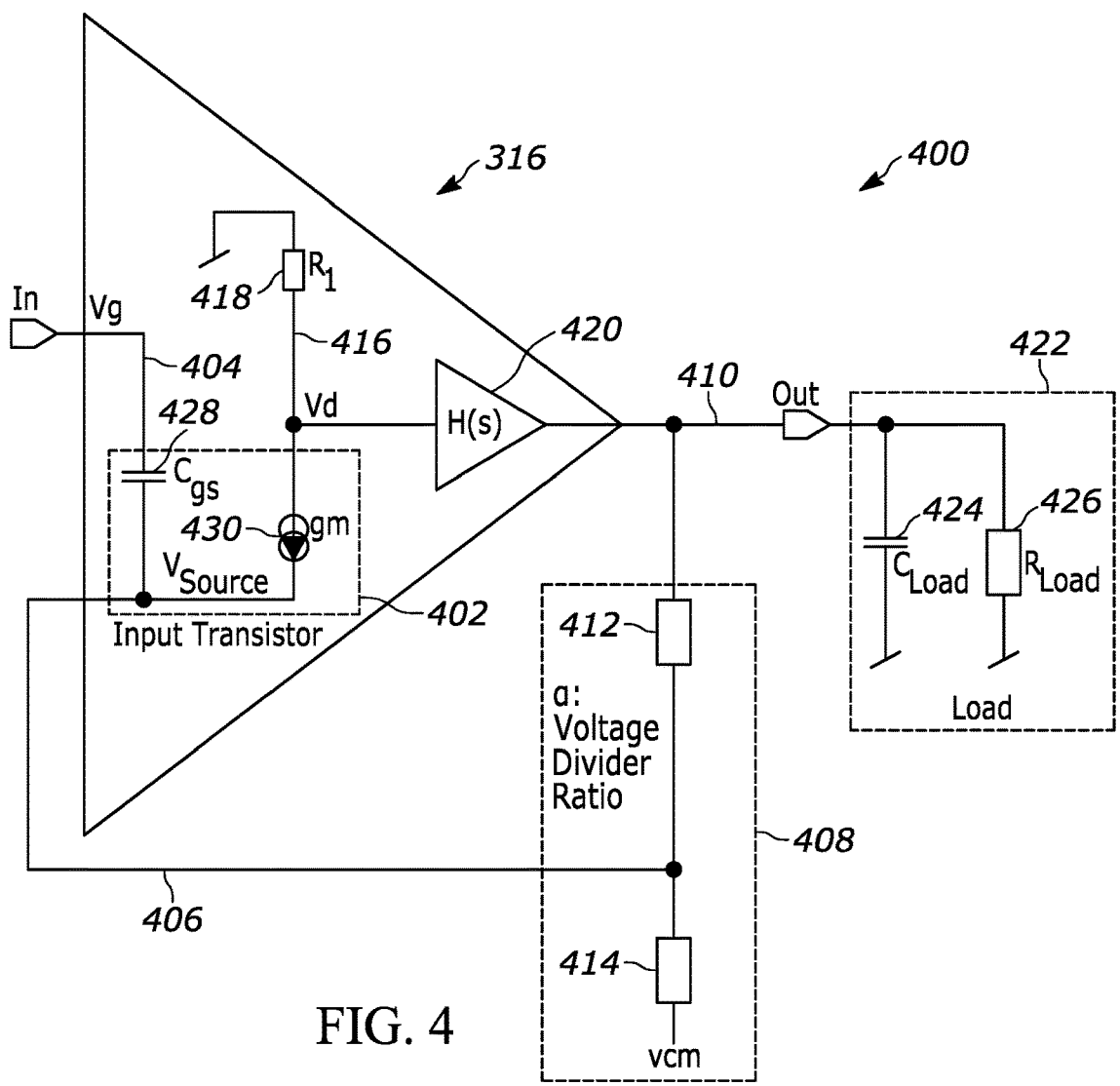
FIG. 4 is a more detailed schematic diagram of an exemplary amplifier of the electrical circuit of the MEMS sensor assembly, illustrated in FIG. 3, which includes an amplifier having an amplifier input stage.

A more detailed schematic diagram 400 of an exemplary amplifier 316 of the electrical circuit of the MEMS sensor assembly, illustrated in FIG. 3, which includes an amplifier having an amplifier input stage is illustrated in FIG. 4. More specifically, the particular type of amplifier illustrated corresponds to a current feedback amplifier.

In the illustrated embodiment, the amplifier 316 includes an amplifier input stage, which is illustrated in the schematic diagram as having an input transistor 402 coupled to receive the signal to be amplified at the gate 404 of the transistor. The source 406 of the input transistor is coupled to a voltage divider network 408, which divides the voltage at the output 410 of the amplifier 316, and feeds back a voltage divided ratio of the output voltage to the source of the input transistor 402. The particular ratio is determined by the values associated with a pair of resistors 412 and 414 in the voltage divider network 408. The drain 416 of the input transistor is coupled to a voltage source via a resistor 418, as well as, is coupled to an input of an amplifier 420 having a gain of H(s). While shown as a resistor 418 in FIG. 4, in at least some embodiments, this resistance can be implemented as a current source with an equivalent source resistance. The output of amplifier 420 is coupled to the input of the voltage divider 408 network as well as the overall output of the amplifier 316. In turn this overall output is supplied to a circuit 422 which is modeled as being a load, which is not part of the amplifier 316, that has a corresponding capacitance 424 and resistance 426.

The input transistor is modeled as having an input gate to source capacitance 428, and a current source 430 coupled between the drain and the source of the input transistor.

The input impedance of the amplifier having a real part resistance and an imaginary part reactance can be calculated as follows:

$$Z_{IN}(s) = \frac{V_{IN}(s)}{I_{IN}(s)} = \frac{V_{IN}(s)}{V_{GS}(s) \cdot sC_{GS}} = \frac{V_{IN}(s)}{V_{GS}(s)} \cdot \frac{1}{sC_{GS}}$$

$$V_{IN}(s) = V_{GS}(s) \cdot \left(1 + \frac{\alpha \cdot A}{1 + sP_1}\right)$$

$$\frac{V_{IN}(s)}{V_{GS}(s)} = (1 + \alpha A) \cdot \frac{1 + s\frac{P_1}{1 + \alpha}}{1 + sP_1}$$

Figure 5:
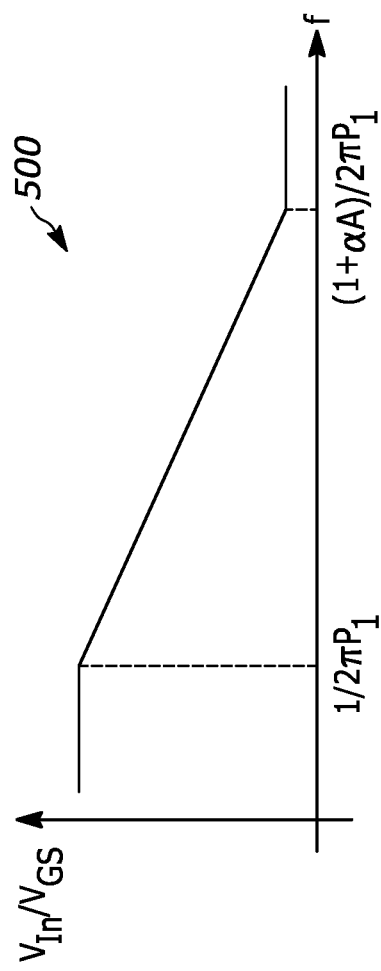
FIG. 5 is a graph illustrating the ratio of the input voltage to the gate-to-source voltage as a function of frequency for the current feedback amplifier illustrated in FIG. 4.

FIG. 5 is a graph 500 illustrating the ratio of the input voltage to the gate-to-source voltage ($V_{IN}/V_{GS}$) as a function of frequency for the current feedback amplifier 316 illustrated in FIG. 4. For a frequency between $\frac{1}{2}\pi P_1$ and $(1+\alpha A)/2\pi P_1$ the ratio has a value of $\sim 1/(j \cdot \omega)$.

For the frequency range $\frac{1}{2}\pi P_1 < f < (1+\alpha A)/2\pi P_1$ with $s = j\omega$:

$$Z_{IN}(\omega) = \frac{V_{IN}(\omega)}{V_{GS}(\omega)} \cdot \frac{1}{j\omega C_{GS}} = \varsigma \cdot \frac{1}{j\omega} \cdot \frac{1}{j\omega C_{GS}} = -\frac{\varsigma}{\omega^2 C_{GS}}$$

The input impedance is calculated as having a negative real part, which in turn can result in a negative input current, when a voltage is applied to the input of the amplifier 316. As noted above, additional examples of amplifier architectures that can have a negative input resistance include simple source follower amplifiers, super source follower amplifiers, and amplifiers having a gm input stage.

As noted above this can have consequences, such as when associated with a MEMS motor having a relatively high quality (Q) factor. In turn, this can affect the circuit's ability to dampen out any mechanical and/or acoustic resonators that may be associated with the MEMS motor.

Figure 6:
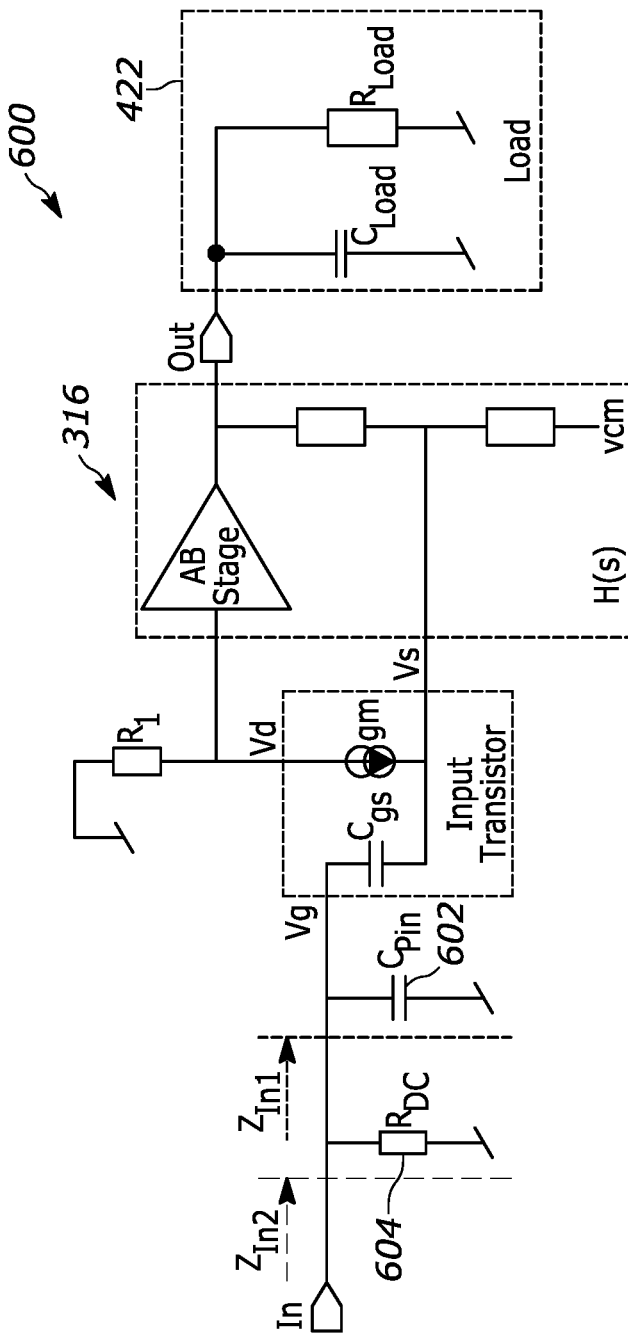
FIG. 6 is a schematic diagram of a current feedback amplifier, which extends the model to include a parasitic capacitance and a DC resistance associated with various DC operating points.

In at least some real world applications, an input impedance can have additional components, such as additional capacitances and additional resistances. For example, additional capacitances can include various parasitic capacitances, and additional resistances can involve a relatively high ohmic resistor associated with a DC operating point circuit, which are connected to the amplifier input. FIG. 6 illustrates a schematic diagram 600 of a current feedback amplifier, which extends the above discussed model to include a parasitic capacitance 602 and a DC resistance 604 associated with a DC operating point. In turn these additional sources of input resistance together with the input impedance of the amplifier 316 are represented by the designations $Z_{IN1}$ and $Z_{IN2}$.

Generally, the real part of the total input impedance $Z_{IN2}$ can be made less negative by increasing the value of $C_{PIN}$, but it cannot be made positive.

Figure 7:
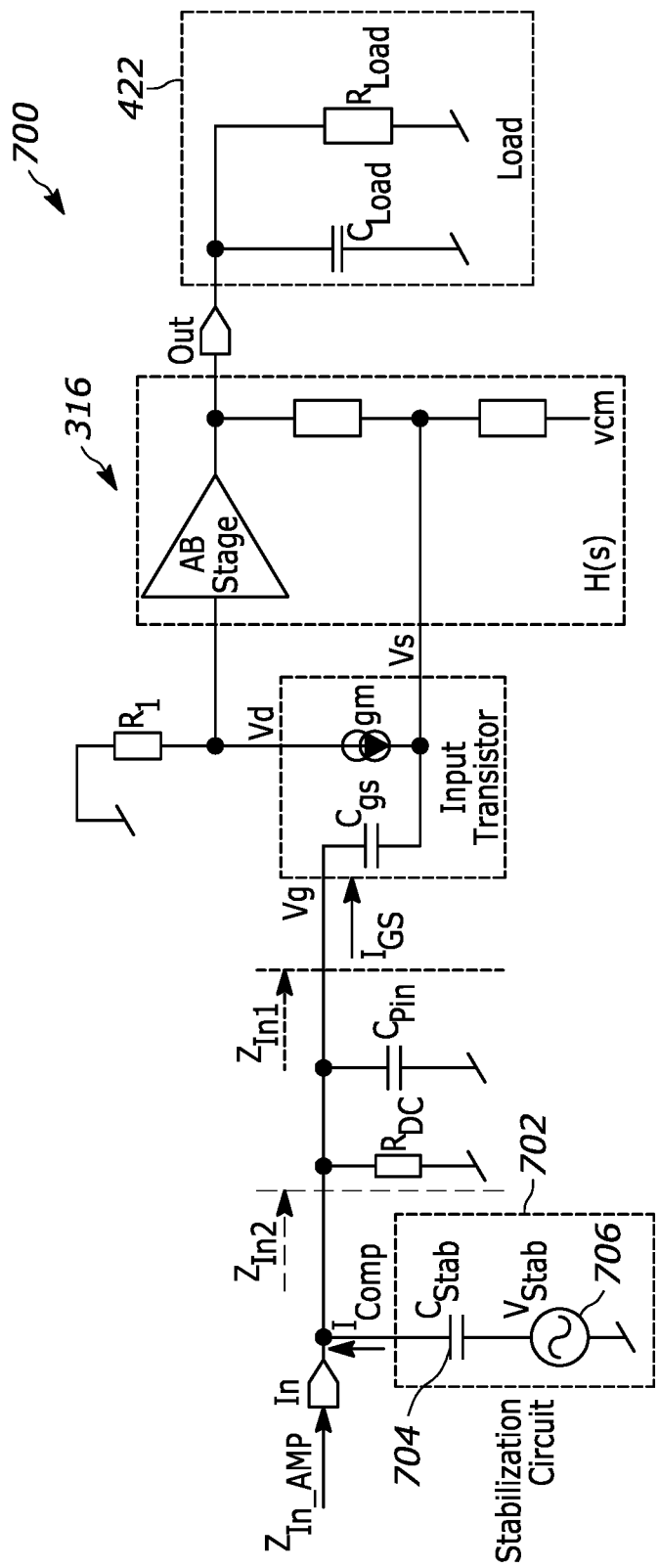
FIG. 7 is a schematic diagram of a MEMS sensor assembly with an electrical circuit having a stabilization circuit.

In order to address the negative real part of the amplifier input impedance $Z_{IN2}$, and correspondingly the associated negative input current, a stabilization circuit is additionally included. FIG. 7 illustrates a schematic diagram 700 of a MEMS sensor assembly with an electrical circuit having a stabilization circuit 702. The stabilization circuit 702 is adapted to offset at least a portion of the negative input current associated with the negative input resistance of the amplifier 316. More specifically, the stabilization circuit injects a compensation current, which is produced by the stabilization circuit, at the input of amplifier 316 and correspondingly the input of the amplifier input stage.

In the illustrated example, the stabilization circuit includes a stabilization capacitor 704, which is driven by a stabilization voltage source 706. In order to produce a current, which helps to offset at least a portion of the negative input current, the phase of the voltage source 706 has a phase shift between −180 and 0 degrees, and preferably a phase shift closer to −90 degrees, relative to the amplifier output. A phase shift proximate −90 degrees will produce a compensation current ($I_{COMP}$) that has an opposite phase relative to the negative input current ($I_{GS}$) resulting from the negative input resistance of the amplifier input stage of amplifier 316. This assumes that the value of $C_{PIN}$ is close to zero, and the value of $R_{DC}$ is close to infinity. If the compensation current is large enough and has a positive real part at the frequency of interest (i.e. the resonance frequency of the MEMS motor), then the real part of the amplifier impedance can be made positive. The size of the compensation current can be affected by the size of the stabilization capacitor, $C_{STAB}$, 704, and/or the amplitude of the stabilization voltage source, $V_{STAB}$, 706.

Figure 8:
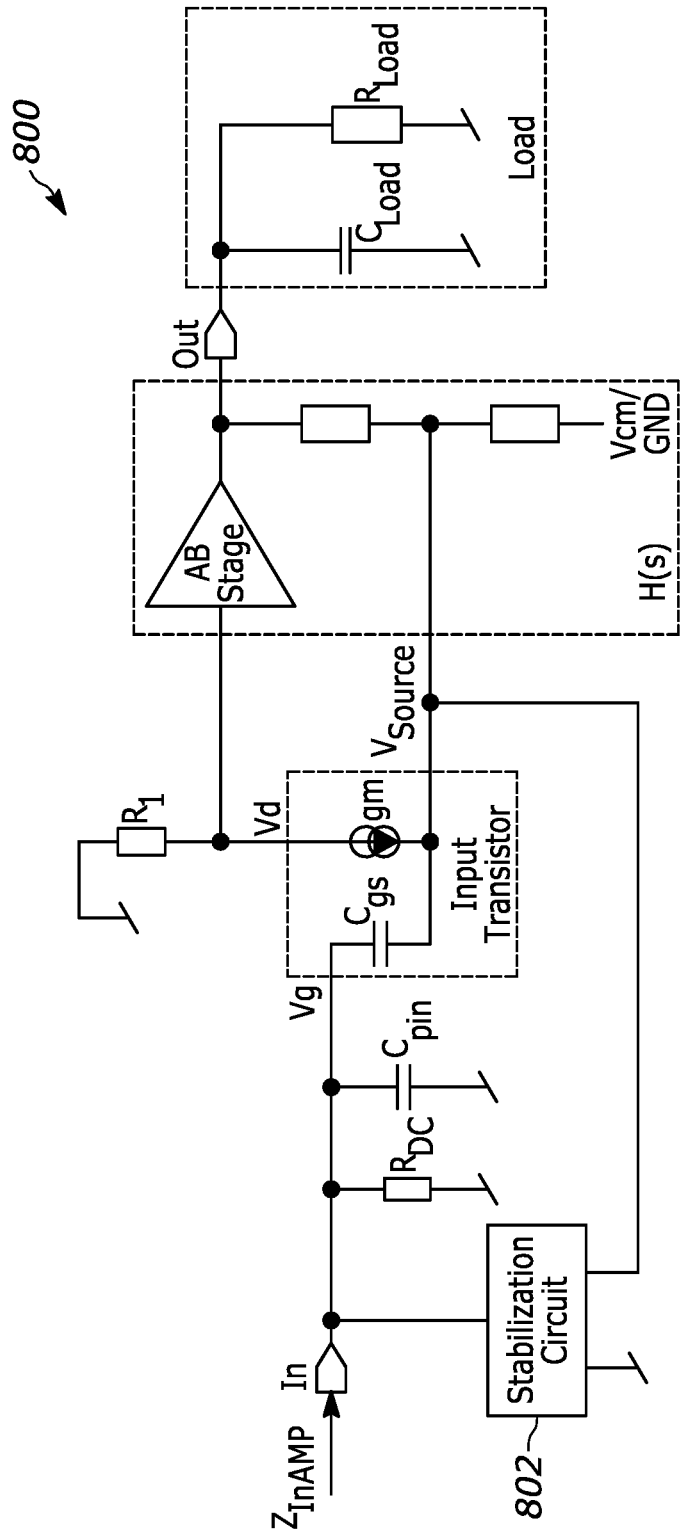
FIG. 8 is a schematic diagram of a MEMS sensor assembly, where the stabilization circuit includes a feedback voltage from the output of the amplifier circuit.

In at least some instances, the stabilization circuit can be coupled to the amplifier output or the voltage divided output of the amplifier output. FIG. 8 illustrates a schematic diagram 800 of a MEMS sensor assembly, where the stabilization circuit 802 includes a feedback voltage, which is determined from the output of the amplifier circuit.

Figure 9:
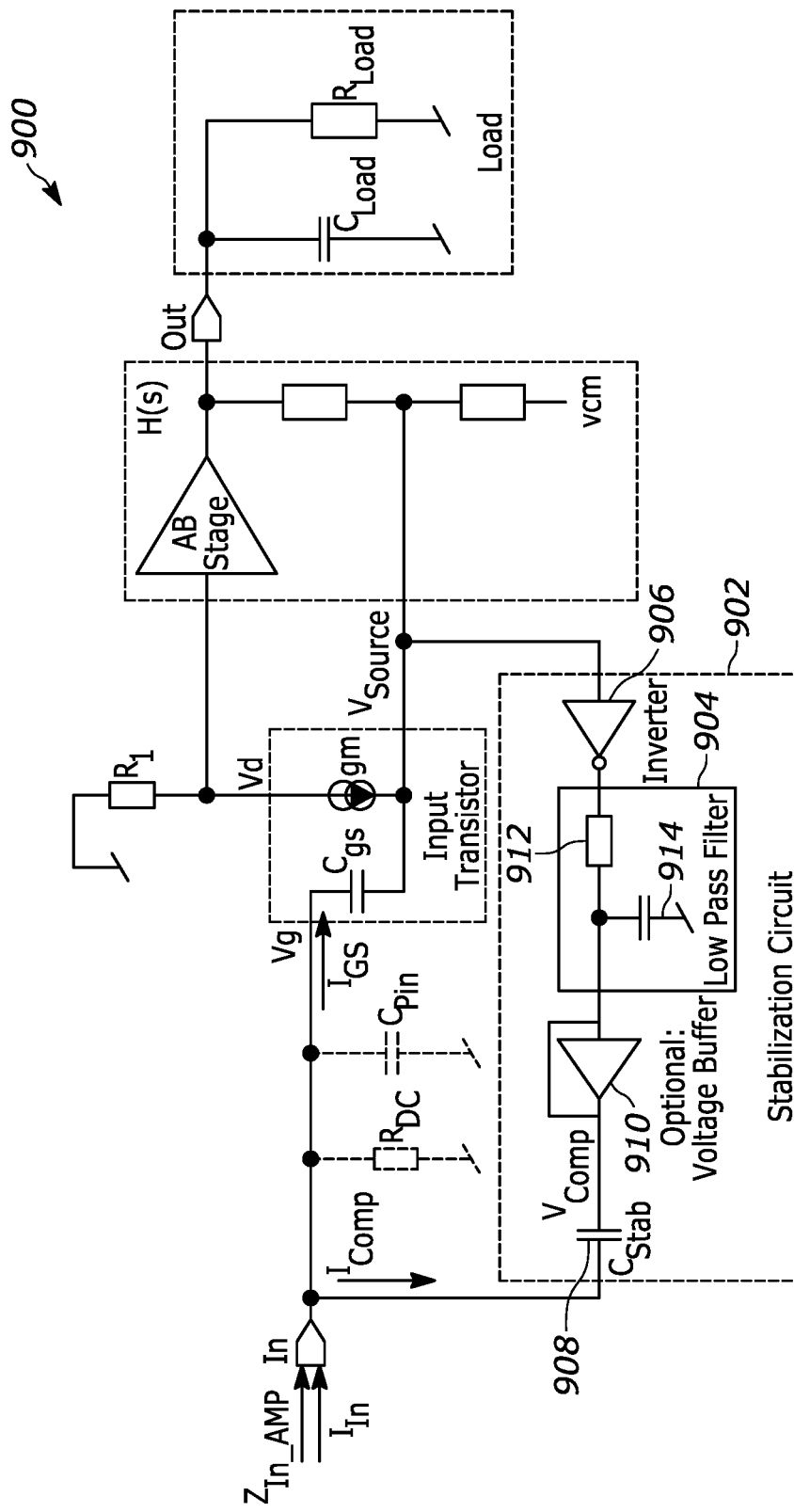
FIG. 9 is a schematic diagram of a MEMS sensor assembly where the feedback voltage path includes a low pass filter.

FIG. 9 illustrates a schematic diagram 900 of a MEMS sensor assembly including a more detailed exemplary stabilization circuit 902, where the feedback path includes a low pass filter 904. The inclusion of a low pass filter will introduce a potential phase shift between zero and −90 degrees. This can be coupled in series with an inverter 906, which will introduce a further phase shift of 180 degrees, which is applied to the stabilization capacitor 908. The feedback path which produces the compensation voltage could optionally further include a voltage buffer 910 coupled in series, which would generally not affect the phase of the compensation voltage.

At least one possible implementation of the low pass filter could include a simple first order passive RC filter, which has a series resistor 912 with a capacitor 914 coupled between the series path and ground. Generally, the low pass filter will produce a −45 degree phase shift at the cutoff or corner frequency. A frequency higher than the cutoff frequency will produce a phase shift closer to −90 degrees, where a frequency lower than the cutoff frequency will produce a phase shift closer to 0 degrees. The optional voltage buffer could have a gain that is set to 1. However if desired, the optional voltage buffer could have a lower or higher gain depending on the requirements for and sizing of the stabilization circuit.

While not shown, it is further possible that the low pass filter could be implemented with a higher order version of a low pass filter and/or could make use of an active filter. The cutoff frequency of the first order low pass filter can be selected by choosing the respective values of the associated capacitor 914 and resistor 912, such that the phase shift $\Delta \varphi$ at the frequency of interest (i.e. the resonance frequency of the MEMS motor), produces a stabilization current through the stabilization capacitor 908, which results in an input current $I_{IN}$ ($I_{GS}+I_{COMP}$) that leads to an overall input resistance which is less negative, and which preferably is no more negative than the positive value of the internal resistance of the MEMS motor. In other words, the resulting adjusted $Re[Z_{INAMP}]$ when added to the internal resistance of the MEMS motor should have a sum that is greater than zero with sufficient margin. The amount of adjustment may need to account for the effects, if any, of additional components and/or parasitic effects, such as $R_{DC}$ and $C_{PIN}$.

Figure 10:
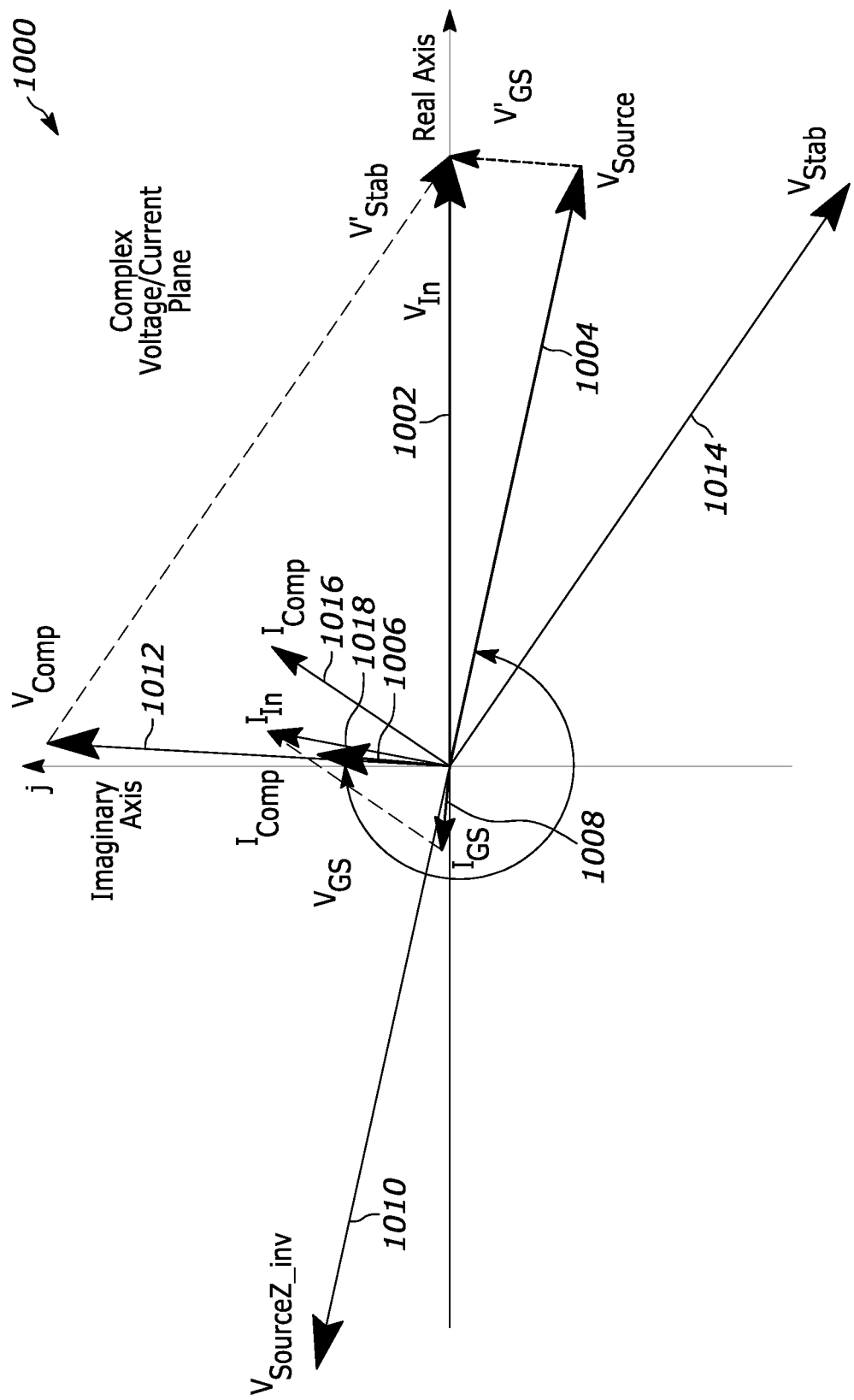
FIG. 10 is a graph highlighting the effect of the low pass filter on the input resistance of the amplifier in the voltage feedback path of the stabilization circuit.

FIG. 10 illustrates a graph 1000, which highlights the effect of the low pass filter on the input resistance of the amplifier in the voltage feedback path of the stabilization circuit. For the following discussion, the voltages and phases of the described signals are assumed to be for frequencies around the resonance frequency of the MEMS motor for which it is desired to be better stabilized.

The input voltage $V_{IN}$ 1002 is applied to the input of the amplifier. $V_{IN}$ is assumed to have a phase $\varphi$ of zero degrees. The voltage $V_{SOURCE}$ 1004 at the source of the of the amplifier input stage is slightly delayed with respect to $V_{IN}$.

This represents a resulting phase for $V_{SOURCE}$ that is negative with respect to $V_{IN}$. The voltage difference between $V_{IN}$ and $V_{SOURCE}$ defines the value of the gate source voltage $V_{GS}$ 1006 of the amplifier input stage. For the frequency of interest, the phase of $V_{GS}$ is close to 90 degrees. The phase of the corresponding current $I_{GS}$ 1008 is shifted relative to the voltage by approximately 90 degrees, and results in a real part that is negative.

The inverter applied to $V_{SOURCE}$ produces a voltage $V_{SOURCE\_INV}$ 1010 that is inverted relative to the original signal 1004. The low pass filter 904 of the stabilization circuit 902 shifts the phase of the signal at the output of the filter relative to the signal at the input of the filter, thereby resulting in a voltage $V_{COMP}$ 1012. As a result, the signal V COMP has a total phase shift $\Delta\varphi$ with respect to $V_{SOURCE}$ in the range of 180 to 270 degrees, depending upon the cutoff frequency of the low pass filter relative to the frequency of interest. Preferably, the total phase shift $\Delta\varphi$ is close to 270 degrees. This can be achieved if the cutoff frequency of the low pass filter is between 1 and 10 times higher than the frequency of interest, and preferably between 1 and 5 times higher than the frequency of interest.

The voltage $V_{STAB}$ 1014 across the stabilization capacitor $C_{STAB}$ is the difference between $V_{IN}$ 1002 and $V_{COMP}$ 1012. The current $I_{COMP}$ 1016 through the stabilization capacitor $C_{STAB}$ is 90 degrees phase shifted with respect to the corresponding voltage $V_{STAB}$ 1014 across the capacitor. The total current $I_{IN}$ 1018 into the amplifier is the sum of the currents $I_{COMP}$ 1016+$I_{GS}$ 1008.

For a stable circuit, the stability criterion $Re[Z_{IN\_AMP}] \geq -R_{MEMSres}$, should be fulfilled.

$$Z_{IN\_AMP} = \frac{V_{IN}}{I_{IN}} = \frac{V_{IN}}{I_{INpk} \cdot (\alpha + j\beta)} = \frac{V_{IN}}{I_{INpk}} \cdot \frac{\alpha - j\beta}{\alpha^2 + \beta^2}$$

$$Re[Z_{IN\_AMP}] = \frac{V_{IN}}{I_{INpk}} \cdot \frac{\alpha}{\alpha^2 + \beta^2} > -R_{MEMSres}$$

For a stable circuit, the real part of the input current $Re[I_{IN}]=\alpha I_{INpk}$ should be positive. The cutoff frequency of the low pass filter and the size of the stabilization circuit can be adjusted to provide desired performance, relative to at least a couple of managed criteria, such as signal attenuation, noise, etc. Generally, in accordance with at least one preferred embodiment, the cutoff frequency will be in the range of 1 to 5 times the critical resonance frequency.

Figure 11:
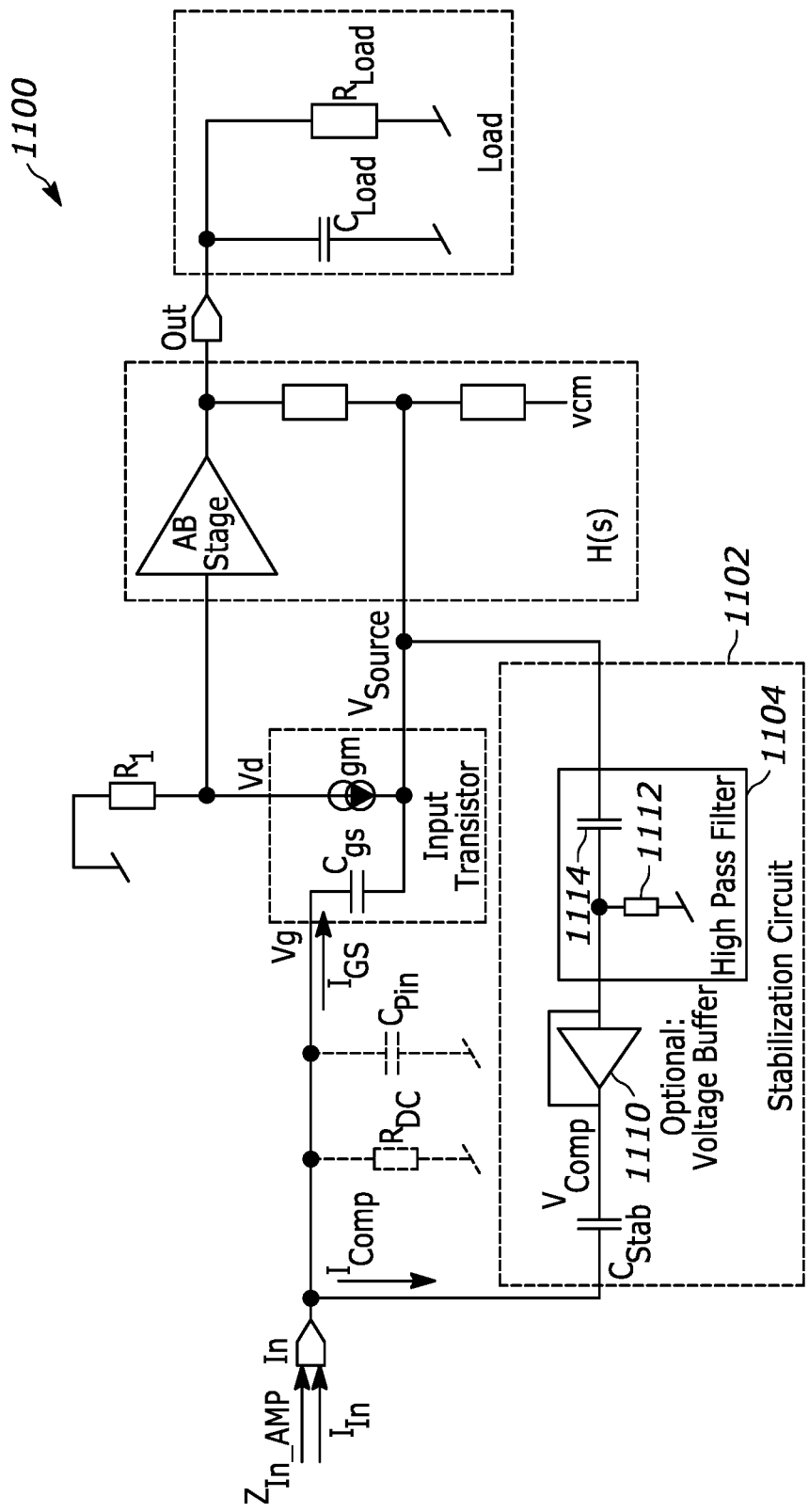
FIG. 11 is a schematic diagram of a MEMS sensor assembly where the feedback voltage path includes a high pass filter.

FIG. 11 illustrates a schematic diagram 1100 of a MEMS sensor assembly where the feedback voltage path includes a high pass filter. The present embodiment differs from the low pass filter version illustrated in FIG. 9, in so far as a high pass filter 1104 is provided in place of the low pass filter 904 in the stabilization circuit 1102, and no inverter is used. As opposed to introducing up to a −90 degree phase shift by the low pass filter, the high pass filter will introduce between a +90 degree and a zero degree phase shift. The feedback path which produces the compensation voltage could optionally further include a voltage buffer 1110 coupled in series, which would generally not affect the phase of the compensation voltage.

At least one possible implementation of the high pass filter could include a simple first order passive RC filter, which has a series capacitor 1114 with a resister 1112 coupled between the series path and ground. Generally, the high pass filter will produce a +45 degree phase shift at the cutoff or corner frequency. A frequency higher than the cutoff frequency will produce a phase shift closer to 0 degrees, where a frequency lower than the cutoff frequency will produce a phase shift closer to +90 degrees. The optional voltage buffer could have a gain that is set to 1. However if desired, the optional voltage buffer could have a lower or higher gain depending on the requirements for and sizing of the stabilization circuit.

While not shown, it is further possible that the high pass filter could be implemented with a higher order version of a high pass filter and/or could make use of an active filter. The cutoff frequency of the first order low pass filter can be selected by choosing the respective values of the associated capacitor 1114 and resistor 1112, such that the phase shift $\Delta\varphi$ at the frequency of interest (i.e. the resonance frequency of the MEMS motor), produces a stabilization current through the stabilization capacitor 908, which results in an input current $I_{IN}$ ($I_{GS}+I_{COMP}$) that leads to an overall input resistance which is less negative, and which preferably is no more negative than the positive value of the internal resistance of the MEMS motor. In other words, the resulting adjusted $Re[Z_{IN\_AMP}]$ when added to the internal resistance of the MEMS motor should have a sum that is greater than zero with sufficient margin. The amount of adjustment may need to account for the effects, if any, of additional components and/or parasitic effects, such as $R_{DC}$ and $C_{PIN}$.

Figure 12:
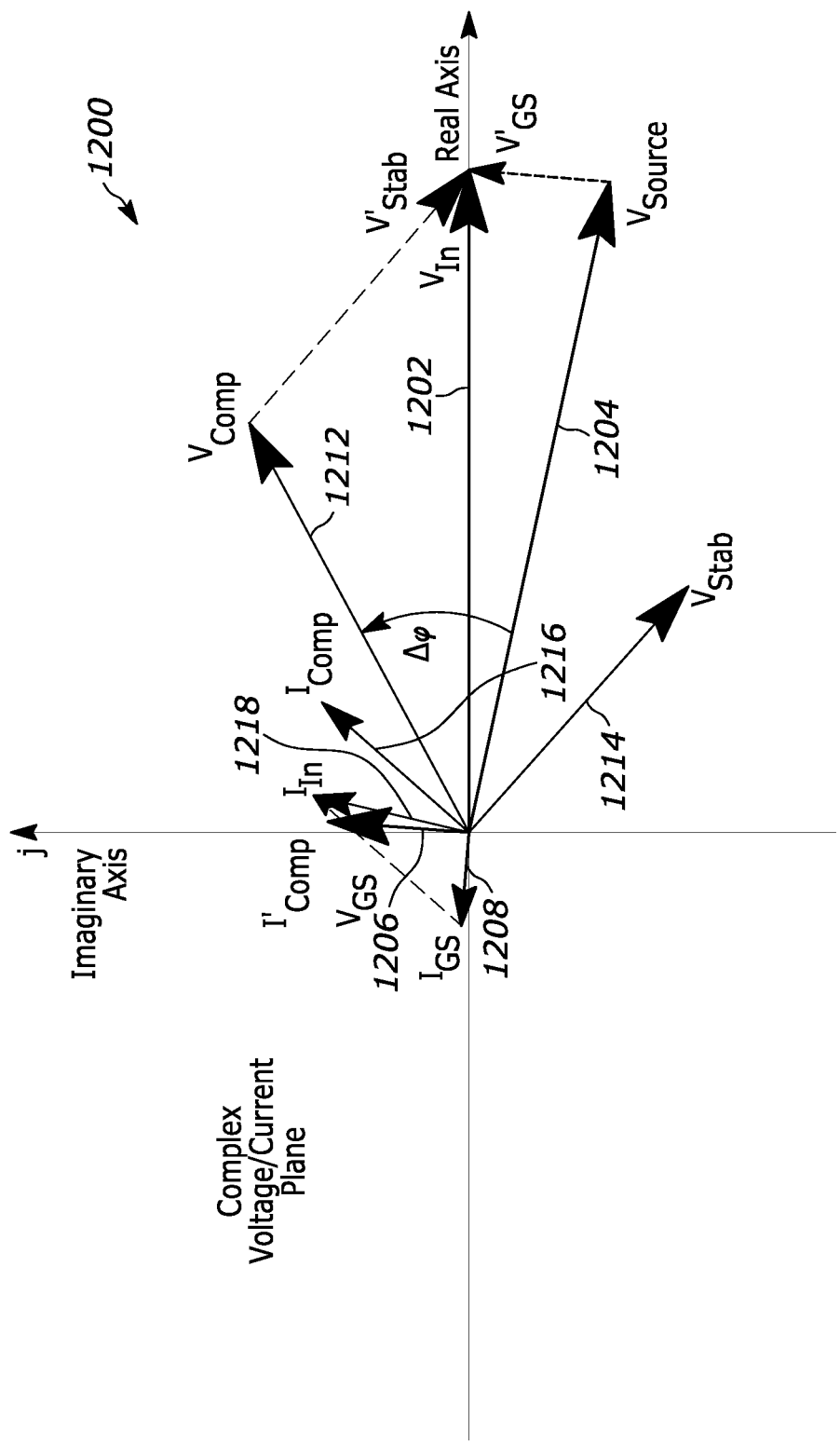
FIG. 12 is a graph highlighting the effect of the high pass filter on the input resistance of the amplifier in the voltage feedback path of the stabilization circuit.

FIG. 12 illustrates a graph 1200 highlighting the effect of the high pass filter on the input resistance of the amplifier in the voltage feedback path of the stabilization circuit. For the following discussion, the voltages and phases of the described signals are assumed to be for frequencies around the resonance frequency of the MEMS motor for which it is desired to be better stabilized.

The input voltage $V_{IN}$ 1202 is applied to the input of the amplifier. $V_{IN}$ is assumed to have a phase $\varphi$ of zero degrees. The voltage $V_{SOURCE}$ 1204 at the source of the of the amplifier input stage is slightly delayed with respect to $V_{IN}$. This represents a resulting phase for $V_{SOURCE}$ that is negative with respect to $V_{IN}$. The voltage difference between $V_{IN}$ and $V_{SOURCE}$ defines the value of the gate source voltage $V_{GS}$ 1206 of the amplifier input stage. For the frequency of interest, the phase of Vas is close to 90 degrees. The phase of the corresponding current $I_{GS}$ 1208 is shifted relative to the voltage by approximately 90 degrees, and results in a real part that is negative.

The high pass filter 1104 of the stabilization circuit 1102 shifts the phase of the signal at the output of the filter relative to the signal at the input of the filter, thereby resulting in a voltage $V_{COMP}$ 1212. Therefore, the signal $V_{COMP}$ has a total phase shift $\Delta\varphi$ with respect to $V_{SOURCE}$ in the range of 0 to 90 degrees, depending upon the cutoff frequency of the high pass filter relative to the frequency of interest. Preferably, the total phase shift $\Delta\varphi$ is close to 90 degrees. This can be achieved if the cutoff frequency of the high pass filter is between 0.1 and 1 times the frequency of interest, and preferably between 0.2 and 1 times the frequency of interest.

The voltage $V_{STAB}$ 1214 across the stabilization capacitor $C_{STAB}$ is the difference between $V_{IN}$ 1202 and $V_{COMP}$ 1212. The current $I_{COMP}$ 1216 through the stabilization capacitor $C_{STAB}$ is 90 degrees phase shifted with respect to the corresponding voltage $V_{STAB}$ 1214 across the capacitor. The total current $I_{IN}$ 1218 into the amplifier is the sum of the currents $I_{COMP}$ 1216+$I_{GS}$ 1208.

Similar to the case involving the use of a low pass filter, above, for a stable circuit, the stability criterion $Re[Z_{IN\_AMP}] \geq -R_{MEMSres}$, should be fulfilled.

$$Z_{IN\_AMP} = \frac{V_{IN}}{I_{IN}} = \frac{V_{IN}}{I_{INpk} \cdot (\alpha + j\beta)} = \frac{V_{IN}}{I_{INpk}} \cdot \frac{\alpha - j\beta}{\alpha^2 + \beta^2}$$

$$Re[Z_{IN_{AMP}}] = \frac{V_{IN}}{I_{INpk}} \cdot \frac{\alpha}{\alpha^2 + \beta^2} > -R_{MEMSres}$$

For a stable circuit, the real part of the input current $RE[II] = \alpha I_{INpk}$ should be positive. The cutoff frequency of the high pass filter and the size of the stabilization circuit can be adjusted to provide desired performance, relative to at least a couple of managed criteria, such as signal attenuation, noise, etc. Generally, in accordance with at least one preferred embodiment, the cutoff frequency will be in the range of 0.2 to 1 times the critical resonance frequency.

The stabilization circuit may include an all pass filter, a signal inverter plus low pass filter, high pass filter, or other appropriate phase adjusting circuit in order to generate the phase needed for $I_{COMP}$ to compensate $I_{IN2}$, such that the input resistance (real part of $Z_{IN}$) avoids an aggregate negative input resistance. In at least some cases, the stabilization circuit will make use of a feedback signal that makes use of the signal at the output of the amplifier, but may alternatively generate and/or make use of a stabilization voltage separate from the output of the amplifier.

While the above embodiments, have been largely focused on single ended sensor use cases, the present approach is further applicable to differential sensor use cases, in which case a separate stabilization circuit could be associated with each one of the outputs of a differential MEMS motor.

Figure 13:
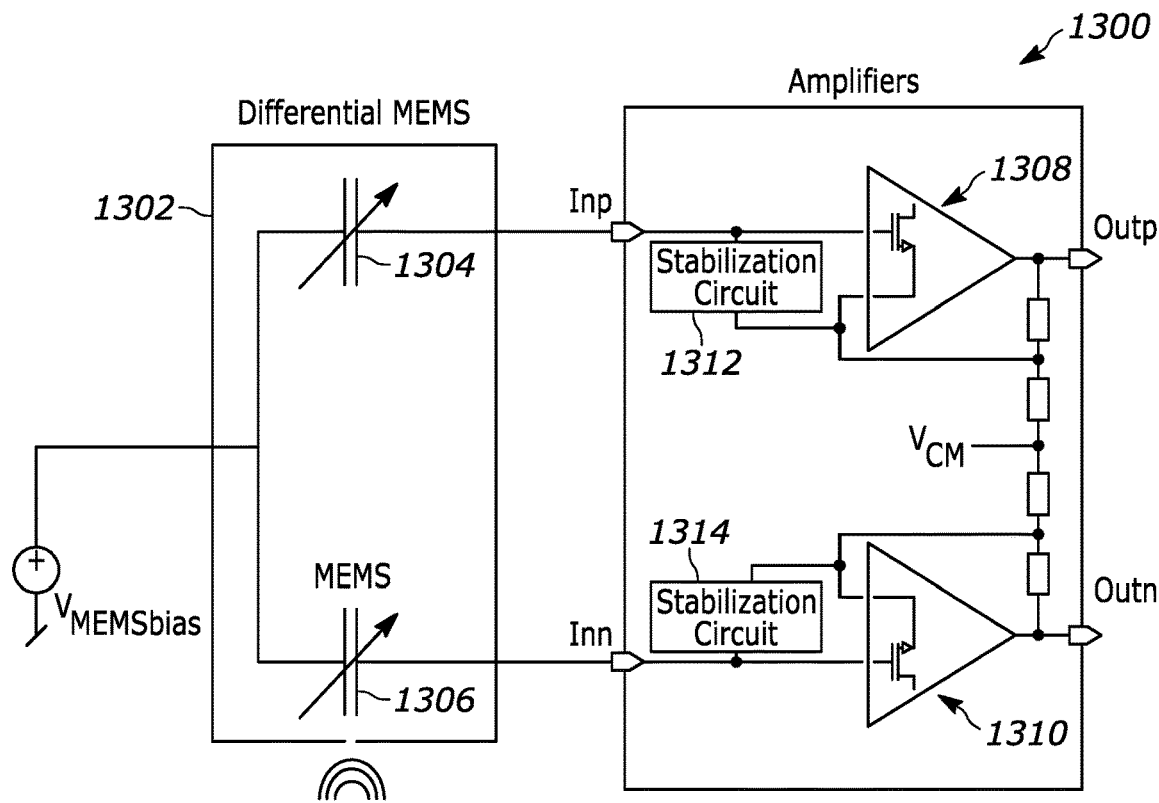
FIG. 13 is a schematic diagram of a differential MEMS sensor assembly with an electrical circuit having a pair of stabilization circuits.

FIG. 13 illustrates a schematic diagram 1300 of a differential MEMS sensor assembly with an electrical circuit having a pair of stabilization circuits for use with a differential MEMS sensor. The differential MEMS sensor assembly differs from the corresponding single ended version, such as the sensor illustrated in FIG. 3, in so far as the differential MEMS 1302 in addition to incorporating the first MEMS sensor 1304, incorporates a further second MEMS sensor 1306, which is intended to produce a second sensed signal that often times has an opposite polarity from the first, and the electrical circuit has separate amplifier branches 1308 and 1310 for processing the separate sensor signals being produced by the MEMS sensor. Each amplifier branch of the electrical circuit, can include its own stabilization circuit 1312 and 1314, which can be used to separately compensate for a negative input resistance associated with each one of the two respective amplifier branches. In such an instance, the stabilization circuit can be similar to the types of stabilization circuits described above in FIGS. 7, 8, 9 and 11, with respect to single ended solutions. The effect of the stabilization circuit relative to each of the respective branches is similar to the effect described above relative to their single ended counterparts.

Figure 14:
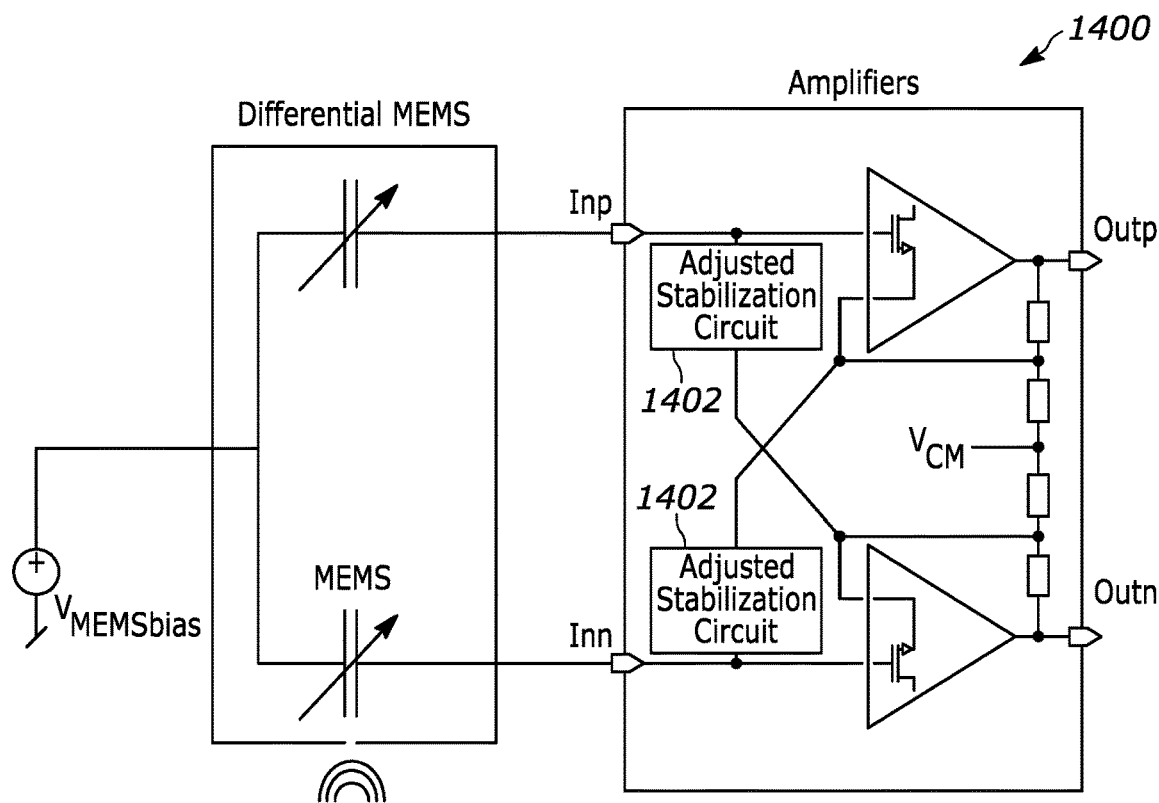
FIG. 14 is a schematic diagram of a further differential MEMS sensor assembly with an electrical circuit having an adjusted pair of stabilization circuits.

FIG. 14 is a schematic diagram 1400 of a further differential MEMS sensor assembly with an electrical circuit having an adjusted pair of stabilization circuits. The differential MEMS sensor assembly of FIG. 14 differs from the differential MEMS sensor assembly of FIG. 13, in that the respective adjusted stabilization circuits 1402 of each of the respective amplifier branches uses the voltage divided ratio of the output voltage of the other branch. It could alternatively be possible to more directly connect the adjusted stabilization circuits 1402 of each of the respective amplifier branches to the output voltage of the other branch, as opposed to the voltage divided ratio, thereof, as shown in FIG. 14.

Since the respective outputs of each branch mirrors the output of the other branch, while having an opposite polarity, this allows the stabilization circuit to receive a version of a voltage divided feedback signal that has already been inverted. This allows for the use of an adjusted stabilization circuit 1402, which may modify the need for the inclusion of an inverter. This would allow the use of an inverter to be avoided for those stabilizations circuits that included an inverter, and alternatively allow for the use of an inverter to be allowed for those stabilization circuits that did not include an inverter. More specifically, this would allow for the use of a form of stabilization circuit that includes a low pass filter without the corresponding use of an inverter. Alternatively, this would allow for the use of a form of stabilization circuit that includes a high pass filter with the use of an inverter.

It is further possible that an adjusted stabilization circuit could be used with one of the branches, while the unadjusted stabilization circuit could be used with the other one of the branches. In such an instance the user would need to manage in each instance, which one of the voltage divided output signals were being used relative to each of the branches. Various combinations along these lines are possible without departing from the teachings of the present invention.

By making use of a stabilization circuit, as taught by the present application, instabilities concerns, which could lead to oscillations in a microelectromechanical systems sensor, may be reduced and/or may be avoided. By increasing the real part of the amplifier input impedance, stability at one or more frequencies of concerns, which may coincide with one or more resonances, may be better addressed and/or avoided.

Still further, in at least some instance, the sensitivity at one or more of the frequencies of interest may be reduced, which in turn could help to increase the value of an acoustic overload point at one or more of frequencies of interest. In such an instance, the attenuation of the input signal can be effected by the stabilization circuit. The stabilization capacitor acts as an additional capacitive load on the input node which can lead to an attenuation. The frequency selectivity of any such attenuation is due to the frequency dependent signal from the low pass or high pass filter. In such an instance, the selective frequency attenuation is not limited to an amplifier having a negative input resistance. This possible effect can be attributed to the capacitive source, associated with the capacitive MEMS motor, and the stabilization capacitor, which forms a capacitive voltage divider.

Figure 15:
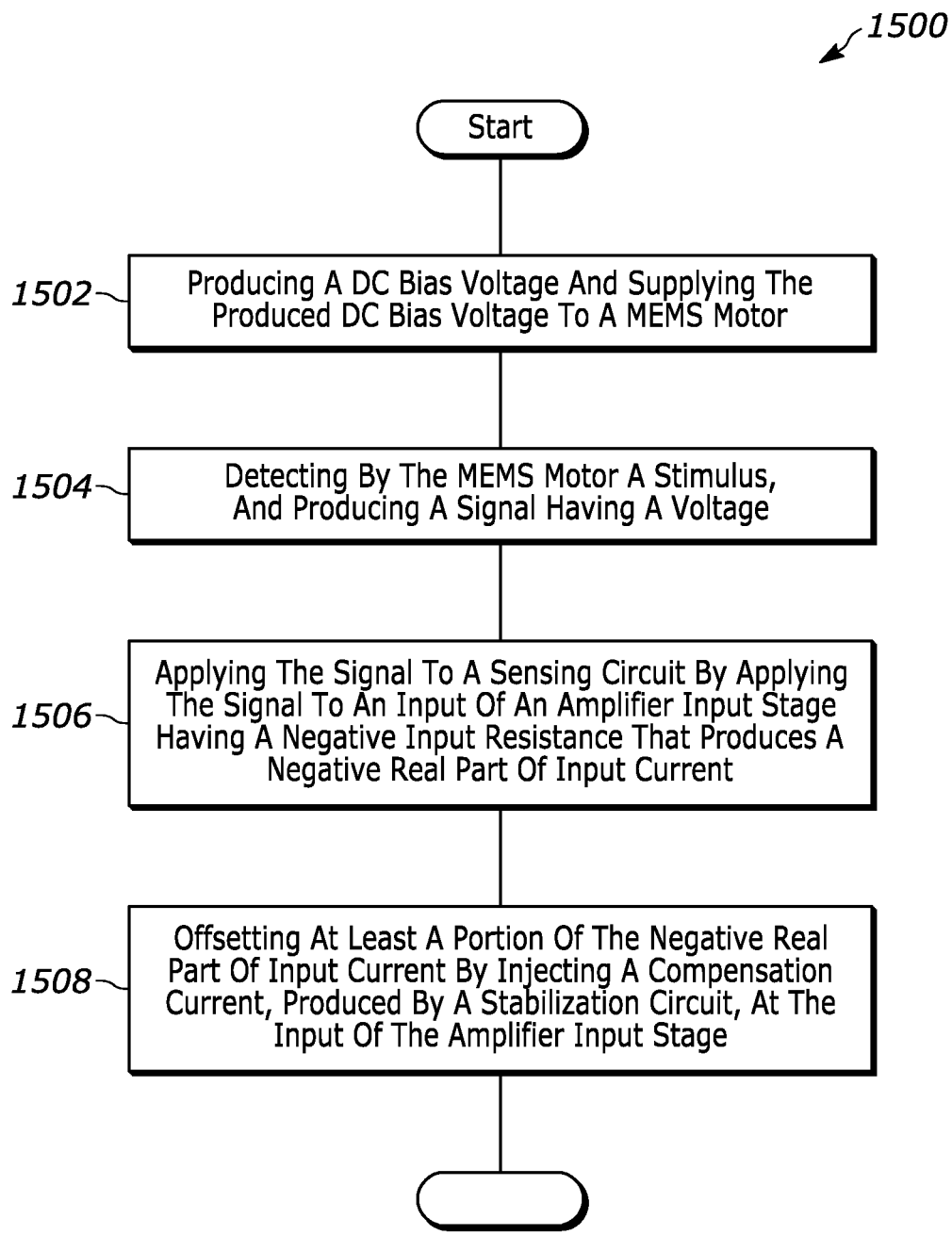
FIG. 15 is a flow diagram of a method of operating a sensor assembly with a stabilization circuit for injecting a compensation current into an amplifier input stage having a negative input resistance for offsetting at least a portion of the negative input resistance.

FIG. 15 illustrates a flow diagram 1500 of an exemplary method of operating a sensor assembly with a stabilization circuit for injecting a compensation current into an amplifier input stage having a negative input resistance for offsetting at least a portion of the negative input resistance. The method includes producing 1502 a DC bias voltage and supplying the produced DC bias voltage to a MEMS motor. A stimulus is detected 1504 by the MEMS motor, and a signal having a voltage is produced. The signal is applied 1506 to a sensing circuit by applying the signal to an input of an amplifier input stage having a negative input resistance that produces a negative input current. At least a portion of the negative input current is offset 1508 by injecting a compensation current, produced by a stabilization circuit, at the input of the amplifier input stage.

In some instances, producing the compensation current includes producing a stabilizing voltage that is phase shifted relative to the signal applied to the input of the amplifier input stage.

It should be understood that, notwithstanding the particular steps as shown in the figures, a variety of additional or different steps can be performed depending upon the embodiment, and one or more of the particular steps can be rearranged, repeated or eliminated entirely depending upon the embodiment. Also, some of the steps performed can be repeated on an ongoing or continuous basis simultaneously while other steps are performed. Furthermore, all or portions of different steps can be performed by different elements or by a single element of the disclosed embodiments.

For at least some embodiments, at least some methods or portions thereof in this disclosure can be implemented on or under the control of a programmed processor or controller. However, the controllers, flowcharts, and modules may also be implemented on or under the control of a general purpose or special purpose computer, a programmed microprocessor or microcontroller and peripheral integrated circuit elements, an integrated circuit, a hardware electronic or logic circuit such as a discrete element circuit, a programmable logic device, or the like.

At least some embodiments can improve operation of the disclosed devices. Also, while this disclosure has been described with specific embodiments thereof, it will be evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

In this document, relational terms such as "first," "second," and the like may be used solely to distinguish one entity or action from another entity or action without necessarily requiring or implying any actual such relationship or order between such entities or actions. The phrase "at least one of," "at least one selected from the group of," or "at least one selected from" followed by a list is defined to mean one, some, or all, but not necessarily all of, the elements in the list. The terms "comprises," "comprising," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising." Furthermore, the background section is written as the inventor's own understanding of the context of some embodiments at the time of filing and includes the inventor's own recognition of any problems with existing technologies and/or problems experienced in the inventor's own work.

What is claimed is:

1. A microelectromechanical systems (MEMS) sensor comprising:
   a housing comprising electrical contacts disposed on an exterior of the housing;
   a capacitive MEMS motor disposed in the housing; and
   an electrical circuit disposed in the housing and electrically coupled to the electrical contacts, the electrical circuit comprising:
      a bias voltage source having an output coupled to an input of the MEMS motor;
      an amplifier including an amplifier input stage having an input, coupled to an output of the MEMS motor, the amplifier input stage having a negative input resistance, where a sum of a series resistance of the MEMS motor at the input and the negative input resistance is less than zero, and wherein application of a signal from the output of the MEMS motor to the input of the amplifier input stage produces a negative real part of input current; and
      a stabilization circuit having an output coupled to the input of the amplifier input stage, where the stabilization circuit injects a compensation current at the input of the amplifier input stage that offsets at least a portion of the negative real part of input current.

2. The MEMS sensor of claim 1 is a microphone having a frequency response between 0.1 Hz and at least 20 KHz.

3. A capacitive microelectromechanical systems (MEMS) motor sensing circuit comprising:
   an amplifier input stage having an input connectable to an output of a MEMS motor, the amplifier input stage having a negative input resistance, wherein application of a signal from the output of the MEMS motor to the input of the amplifier input stage produces a negative real part of input current; and
   a stabilization circuit having an output coupled to the input of the amplifier input stage, where the stabilization circuit is adapted to inject a compensation current at the input of the amplifier input stage that offsets at least a portion of the negative real part of input current.

4. The sensing circuit in accordance with claim 3, wherein the sensing circuit has an effective input resistance and wherein an amount of the injected compensation current is set at a level where a magnitude of the effective input resistance is less than or equal to a magnitude of the series resistance of the MEMS motor.

5. The sensing circuit in accordance with claim 4, wherein the sum of the effective input resistance and the series resistance of the MEMS motor is not less than zero.

6. The sensing circuit in accordance with claim 3, wherein the stabilization circuit includes a stabilizing voltage source that is phase shifted relative to the signal coupled to the input of the amplifier input stage.

7. The sensing circuit in accordance with claim 6, wherein an amount of the phase shift of the stabilizing voltage source relative to the signal coupled to the input of the amplifier input stage is approximately negative 90 degrees.

8. The sensing circuit in accordance with claim 6, wherein the stabilization circuit has an input coupled to an output of the amplifier input stage, wherein the stabilization circuit further includes a high pass filter coupled to the output of the amplifier input stage.

9. The sensing circuit in accordance with claim 8, wherein the high pass filter has a cut off frequency having a value in a range between 0.1 and 1 times a value of a critical resonance frequency of the MEMS motor.

10. The sensing circuit in accordance with claim 8, wherein the stabilization circuit further includes a voltage buffer coupled in series with the high pass filter.

11. The sensing circuit in accordance with claim 6, wherein the stabilization circuit has an input coupled to an output of the amplifier input stage, wherein the stabilization circuit further includes a low pass filter and an inverter coupled in series to the output of the amplifier input stage.

12. The sensing circuit in accordance with claim 11, wherein the low pass filter has a cut off frequency having a value in a range between 1 and 10 times a value of a critical resonance frequency of the MEMS motor.

13. The sensing circuit in accordance with claim 11, wherein the stabilization circuit further includes a voltage buffer coupled in series with the low pass filter and the inverter.

14. The sensing circuit in accordance with claim 6, wherein the stabilizing voltage source is coupled to the input of the amplifier input stage via a capacitor.

15. The sensing circuit in accordance with claim 3 further comprising:
a further amplifier input stage having an input connectable to a second output of the MEMS motor, the further amplifier input stage having a further negative input resistance, where a sum of the respective series resistance of the MEMS motor at the second input and the further negative input resistance is less than zero, and where a signal produced by the MEMS motor at the second output having a voltage, which is adapted to be applied to the input of the further amplifier input stage having the further negative input resistance, produces a further negative real part of input current; and
a further stabilization circuit having an output coupled to the input of the further amplifier input stage, where the further stabilization circuit is adapted to inject a further compensation current at the input of the further amplifier input stage that offsets at least at least a portion of the further negative real part of input current.

16. The sensing circuit in accordance with claim 15, wherein the stabilization circuit includes a stabilizing voltage source that is phase shifted relative to the signal coupled to the input of the amplifier input stage; and
wherein the stabilization circuit has an input coupled to an output of the further amplifier input stage, wherein the stabilization circuit further includes a low pass filter coupled to the output of the further amplifier input stage.

17. The sensing circuit in accordance with claim 16, wherein the further stabilization circuit includes a further stabilizing voltage source, which is phase shifted relative to the signal coupled to the input of the further amplifier input stage; and
wherein the further stabilization circuit has an input coupled to an output of the amplifier input stage, wherein the further stabilization circuit further includes a further low pass filter coupled to the output of the amplifier input stage for producing the further stabilizing voltage source.

18. The sensing circuit in accordance with claim 3, wherein the MEMS motor is a high Q MEMS motor, and the amplifier input stage is an input stage for a source follower type of amplifier.

19. A method implemented in a capacitive microelectromechanical systems (MEMS) sensor, the method comprising:
producing a DC bias voltage and supplying the produced DC bias voltage to a MEMS motor;
detecting by the MEMS motor a stimulus, and producing a signal having a voltage;
applying the signal to a sensing circuit by applying the signal to an input of an amplifier input stage having a negative input resistance that produces a negative real part of input current; and
offsetting at least a portion of the negative real part of input current by injecting a compensation current, produced by a stabilization circuit, at the input of the amplifier input stage.

20. The method in accordance with claim 19, wherein producing the compensation current includes producing a stabilizing voltage that is phase shifted relative to the signal applied to the input of the amplifier input stage.

* * * * *